US005668047A

United States Patent [19]

Muroya

[11] Patent Number: 5,668,047

[45] Date of Patent: Sep. 16, 1997

[54] METHOD FOR FABRICATING INP DIFFRACTION GRATING AND DISTRIBUTED FEEDBACK LASER

[75] Inventor: Yoshiharu Muroya, Tokyo, Japan

[73] Assignee: NEC Corporation, Tokyo, Japan

[21] Appl. No.: 251,259

[22] Filed: May 31, 1994

[30] Foreign Application Priority Data

May 31, 1993 [JP] Japan .................................... 5-129185

[51] Int. Cl.[6] ........................................ H01L 21/20

[52] U.S. Cl. .................................... 438/31; 148/DIG. 95; 148/DIG. 99; 430/296; 438/32; 438/948

[58] Field of Search .............................. 437/23, 127, 129, 437/904, 905, 228; 148/DIG. 95, DIG. 99; 430/296

[56] References Cited

U.S. PATENT DOCUMENTS

| | | | |
|---|---|---|---|
| 3,901,738 | 8/1975 | Hunsperger et al. | 148/1.5 |
| 5,091,979 | 2/1992 | White | 385/1 |
| 5,217,831 | 6/1993 | White | 430/5 |
| 5,225,039 | 7/1993 | Ohguri | 156/651 |
| 5,264,328 | 11/1993 | DellaGuardia et al. | 430/322 |
| 5,308,721 | 5/1994 | Garofalo et al. | 430/5 |
| 5,357,311 | 10/1994 | Shiraishi | 355/53 |
| 5,368,992 | 11/1994 | Kunitsugu | 430/321 |
| 5,434,026 | 7/1995 | Takatsu et al. | 430/30 |
| 5,471,493 | 11/1995 | Mirov et al. | 372/42 |

FOREIGN PATENT DOCUMENTS

| | | |
|---|---|---|
| 2-172289 | 7/1990 | Japan . |
| 3-110884 | 5/1991 | Japan . |

*Primary Examiner*—John Niebling
*Assistant Examiner*—Long Pham
*Attorney, Agent, or Firm*—Young & Thompson

[57] ABSTRACT

A method for fabricating an InP diffraction grating for a distributed feedback semiconductor laser includes the steps of applying an electron beam resist on a semiconductor substrate, giving electron beam exposure to the electron beam resist and controlling heights of resist patterns by using fixed electron beam diameters but by varying incident electron doses. The semiconductor substrate is dry-etched. The electron beam exposure is such that the incident electron doses are made larger at a center portion than at portions towards two sides of the diffraction grating. Due to the proximity effect, the resist patterns after development will have a lower height and a narrower width at portions at which the incident electron doses are increased and, conversely, a higher height and a wider width at portions at which the incident electron doses are decreased. In a method of fabricating a distributed feedback laser using a substrate of the InP diffraction grating fabricated as above, the method includes the step of sequentially growing on the substrate a waveguide layer, an active layer and a cladding layer. The method enables to fabricate a low distortion distributed feedback laser for analog modulation having non-uniform diffraction gratings.

5 Claims, 3 Drawing Sheets

1

InP Substrate

2

3

1

InP Substrate

2

METHOD FOR FABRICATING INP DIFFRACTION GRATING AND DISTRIBUTED FEEDBACK LASER

BACKGROUND OF THE INVENTION (1) Field of the Invention

The present invention relates to a method for fabricating a distributed feedback laser, and more particularly to a low distortion distributed feedback laser for analog modulation.

(2) Description of the Related Art

Conventionally, a diffraction grating of a distributed feedback laser was formed with an optical interference exposure process. With such a method, however, it was difficult to form a diffraction grating having a non-uniform distribution in pitches and depths thereof or to form a diffraction grating at partial or local regions. It was also difficult to form a diffraction grating in a large area on a semiconductor substrate.

There is a known technique for forming a laser element in which, as a method for forming non-uniform diffraction gratings, an electron beam exposure is used, and which comprises the steps of uniformly coating an electron beam resist 1 on a semiconductor substrate (InP substrate) 2 as illustrated in FIG. 1A, varying electron beam diameters during the application of the electron beam exposure, forming diffraction grating patterns whose widths are narrower at a center portion and wider towards side portions as shown in FIG. 1B, and forming diffraction gratings having different heights by a wet-etching process.

However, in the conventional method explained above in which the electron beam diameters are varied to form non-uniform grating patterns, it was difficult to control the heights of resist by the electron beam exposure, and it was also difficult to control the heights of diffraction grating by dry-etching.

SUMMARY OF THE INVENTION

An object of the present invention, therefore, is to overcome the problems existing in the prior art and to provide a method for fabricating a low distortion distributed feedback laser for analog modulation with a high production yield through simple processes.

According to one aspect of the invention, there is provided a method for fabricating an InP diffraction grating for a distributed feedback semiconductor laser, the method comprising the steps of:

applying an electron beam resist on an InP semiconductor substrate;

giving electron beam exposure to the electron beam resist and controlling heights of resist patterns by using fixed electron beam diameters but by varying incident electron doses;

developing the electron beam resist; and etching the semiconductor substrate using the electron beam resist as a mask, the electron beam exposure being such that the incident electron doses are made larger at a center portion that at portions towards two sides of a resonator.

The basic principle of the invention resides in the utilization of a proximity effect of electron beams to develop in the electron beam exposure and in controlling resist pattern heights by simple processes.

In the electron beam exposure, the electron beams diffuse within the resist or reflect on a surface of the substrate resulting in a proximity effect by which the exposure patterns affect one another at portions where they are proximate to one another. This proximity effect appears remarkably especially when fine-line diffraction gratings are formed.

FIG. 3A shows a state wherein the exposure amounts of electron beams (incident electron doses) are different and, due to the proximity effect, the portions exposed to the electron beams become larger at portions at which the incident electron doses are larger (to the right in the drawings) and, inversely, the portions exposed become smaller at portions at which the incident electron doses are smaller (to the left in the drawings). Therefore, as shown in FIG. 3B, the resist patterns after the development result in shapes having a lower height and a narrower width at portions at which the incident electron doses are increased and, conversely, in shapes having a higher height and a wider width at portions at which the incident electron doses are decreased.

According to the invention, the doses of electron beams are varied, and, by utilizing the proximity effect, the heights and widths of the resist pattern shapes are controlled.

Thus, the invention provides a method for fabricating a low distortion distributed feedback laser for analog modulation with high production yields through simpler processes than those in the prior art. Furthermore, where the invention is embodied in a coherent type distributed feedback laser, the occurrence of spatial hole burning in the direction of resonator length can be suppressed so that it is possible to obtain a laser with narrow line widths.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENT OF THE INVENTION

Now, a preferred embodiment of the invention is explained with reference to the accompanying drawings.

Figure 1A:
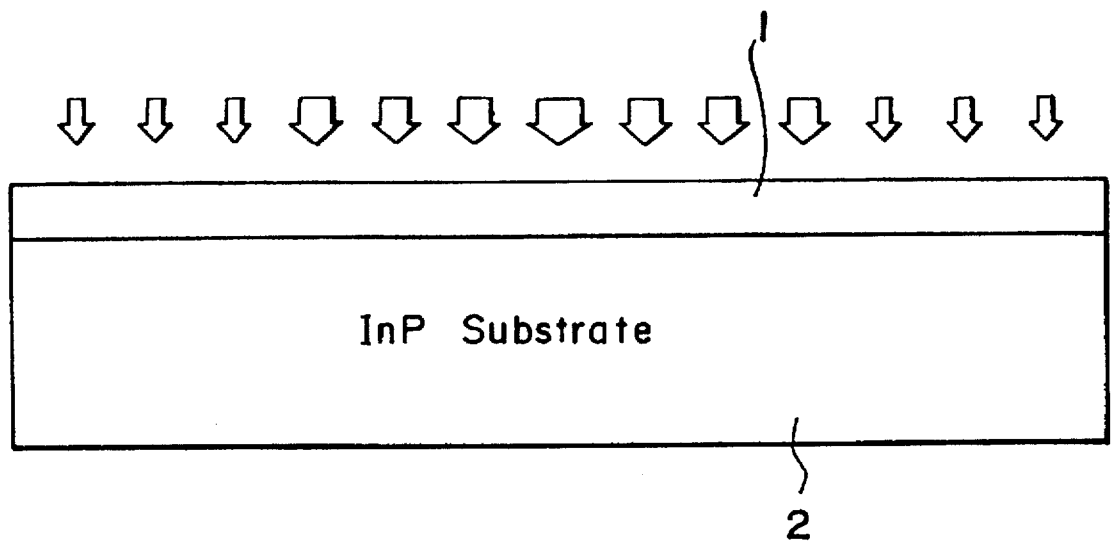
FIGS. 1A and 1B are diagrammatic sectional view of a diffraction grating for a distributed feedback laser for explaining a conventional method for fabricating the same.
Figure 1B:
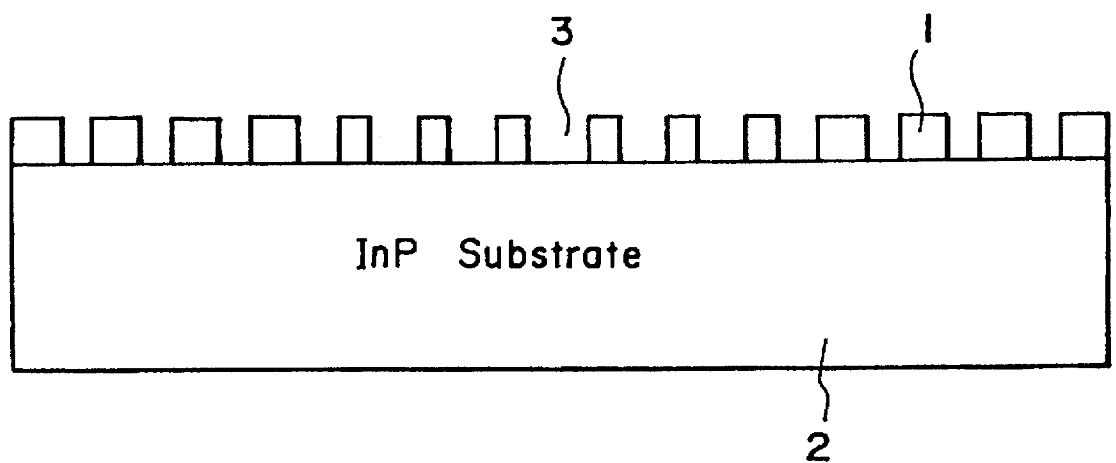
Figure 2A:
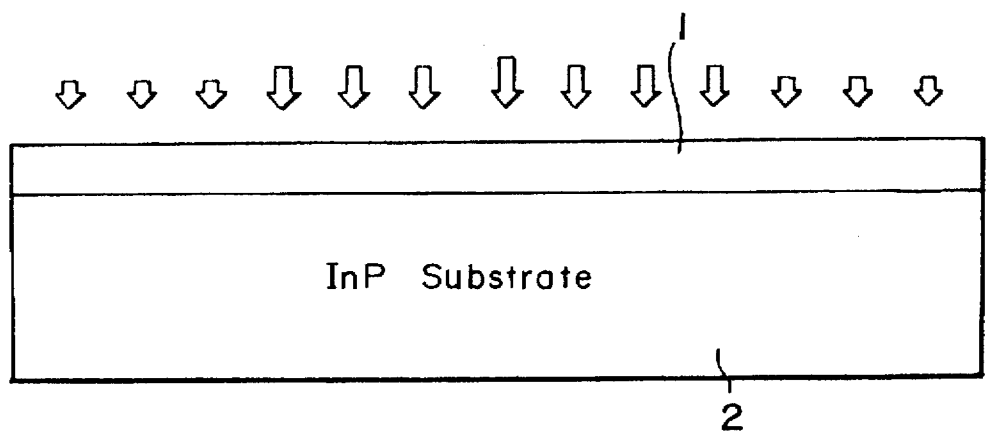
FIGS. 2A, 2B and 2C are diagrammatic sectional or a diffraction grating for a distributed feedback laser for explaining a method for fabricating the same according to the present invention.
Figure 2B:
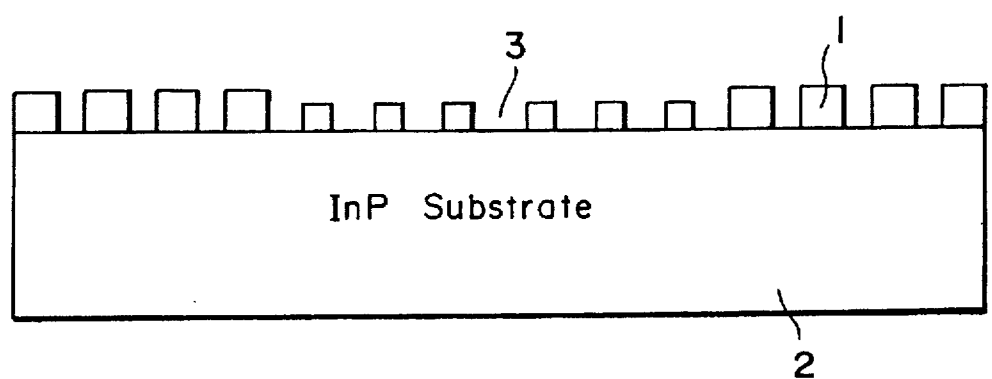
Figure 2C:
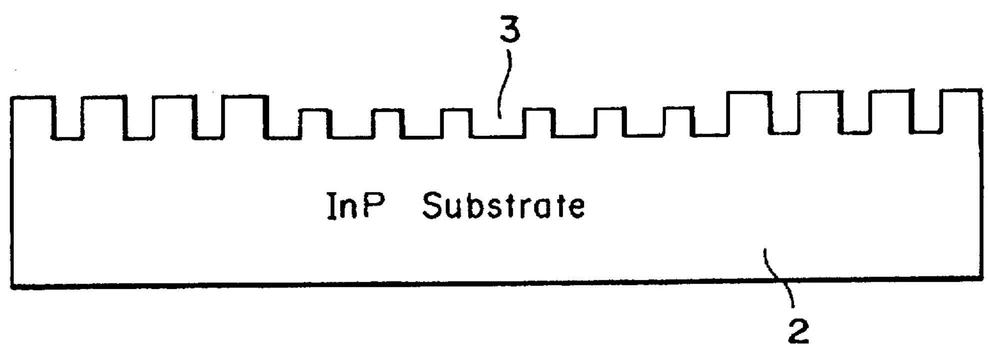
Figure 3A:
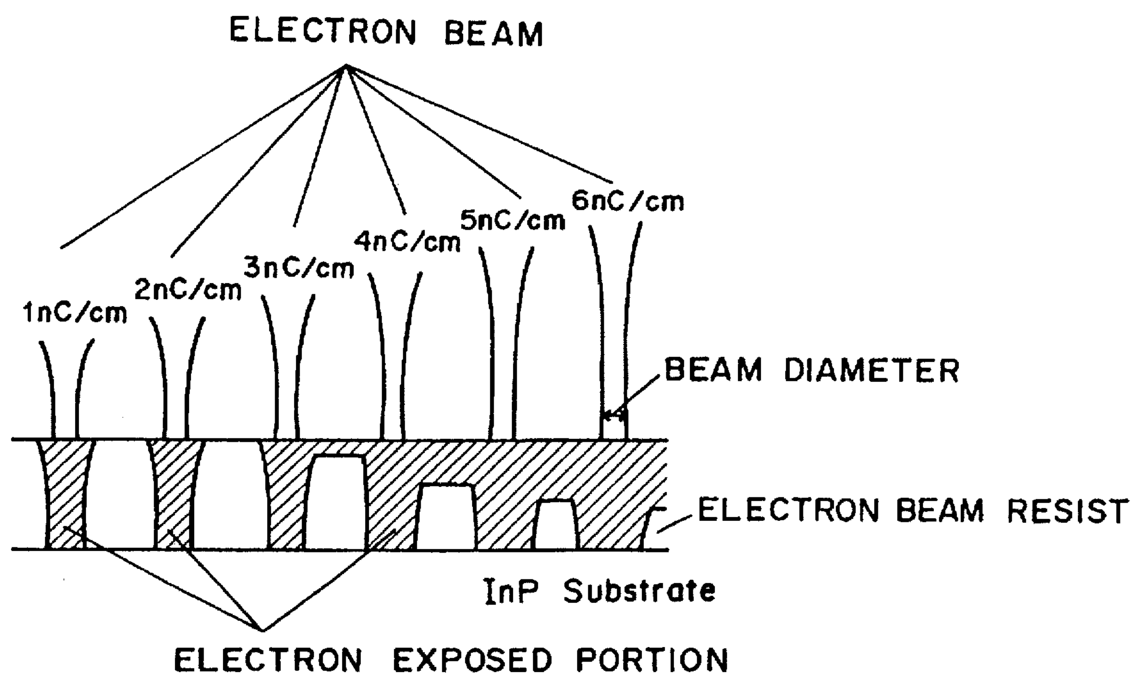
FIGS. 3A and 3B are diagrams showing a portion of the diffraction grating for explaining a proximity effect in the electron beam exposure in an embodiment according to the invention.
Figure 3B:
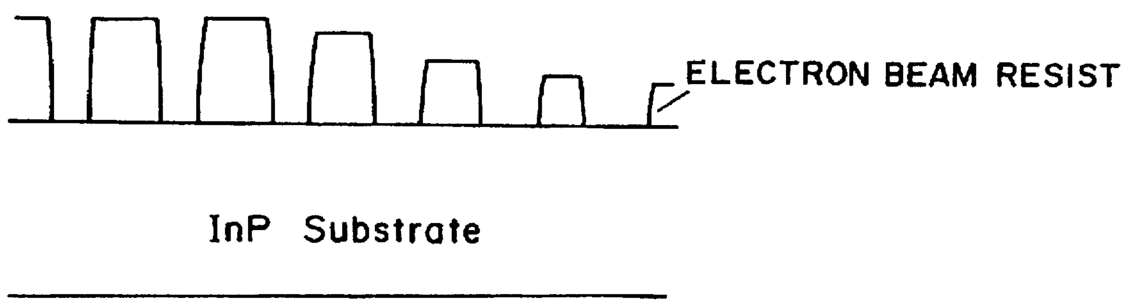

FIGS. 2A, 2B and 2C show in diagrammatic sectional views a diffraction grating of a distributed feedback laser for explaining a fabrication method therefor as an embodiment according to the invention.

First, an electron beam resist PMMA (Poly Methyl Methacrylate) 1 having a thickness of about 1500 Angstroms is uniformly applied on an InP semiconductor substrate 2 as shown in FIG. 2A and, in order to obtain the diffraction grating shapes as designed in advance, the electron beam exposure is applied such that the electron beam doses become larger at a center portion of the resonator than at both end portions thereof. In this case, due to the proximity effect explained above, the resist diffraction patterns formed in the electron beam resist result in a shape having a lower height and a narrower width with an increase in the electron beam doses at center portions of the resonator and is a higher height and a wider width with a decrease in the electron beam doses at both end portions thereof as shown in FIG. 2B. For example, where, by using an electron beam resist in which a PMMA resist of 1500 Angstroms thick is applied, a line-and-space with 0.2 μm pitches which becomes a primary diffraction grating for a 1.3 μm wavelength distributed feedback laser is formed, the electron dose for controlling the proximity effect is 2–4 nC/cm. Also, at the center portion of the diffraction gating, there is formed a phase shift 3 of λ/4. This resist pattern is etched by dry-etching using a $Cl_2$ type gas and is transferred onto the InP substrate 2, whereby a diffraction grating having a non-uniform shape is obtained as shown in FIG. 2C.

On the substrate in which the non-uniform diffraction gratings have been formed, there are sequentially grown by and MOVPE (Metal-Organic Vapor Phase Epitaxy) method an n-InGaAsP waveguide layer, an n-InP spacer layer, an n-In-GaAsP SCH (Separate Confinement Heterostructure) layer, an MQW (Multi-Quantum Well) active layer, a p-InGaAsP SCH layer, and an InP cladding layer, whereby a double hetero-structure wafer having an active optical waveguide is fabricated. Then, the wafer is buried in a DC-PBH (Double-Channel Plainer Buried Heterostructure) by a LPE (Liquid Phase Epitaxy) process, and electrodes are formed at p-side and n-side respectively. Finally, the resulting structure is cleaved to a cavity length 300 μm and both facets are provided with antireflection coatings whereby a low distortion distributed feedback laser for analog modulation is formed.

The element thus formed was evaluated, which showed excellent results with the oscillation threshold value being about 15 mA and the slope effect being 0.4 W/A and, at the modulaation by a 1.5 GHz band 2 tone test, and $IMD_3 \leqq -80$ dBc was obtained under 20% optical modulation. Also, it showed that the uniformity was good and the production yield was improved to over 50%.

In this embodiment of the invention, the electron beam resist employed the PMMA resist but may employ a P (MMA-co-MAA) resist with the same or similar advantage.

Also, the dry-etching using a $Cl_2$ is exemplified in the embodiment but a $CH_4$, $C_2H_6$ type gas may well be used.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating an InP diffraction grating for a distributed feedback semiconductor laser, said method comprising the steps of:

applying an electron beam resist on an InP semiconductor substrate;

exposing said electron beam resist to an electron beam and controlling heights of resist patterns by using fixed electron beam diameters and by varying incident electron doses;

developing said electron beam resist; and dry-etching said semiconductor substrate using said electron beam resist as a mask, said electron beam exposure being such that said incident electron doses are made larger at a center portion than at peripheral portions of said diffraction grating.

2. The method for fabrication an InP diffraction grating according to claim 1, in which said diffraction grating is provided at its center portion with a phase shift of λ/4.

3. A method for fabricating an InP diffraction grating according to claim 1, in which said resist patterns and said InP semiconductor substrate are etched by dry-etching using a $Cl_2$ type gas, said etched resist patterns being transferred to said InP semiconductor substrate during said etching step, thereby to obtain a diffraction grating within said InP semiconductor substrate having a non-uniform shape.

4. A method for fabricating a distributed feedback laser using a substrate of the InP diffraction grating fabricated according to claim 1, in which said method comprises the step of sequentially growing on said substrate a waveguide layer, an active layer and a cladding layer.

5. The method for fabricating an InP diffraction grating for a distributed feedback semiconductor laser according to claim 1, in which said resist patterns after development are such that, due to a proximity effect, they have a lower height and a narrower width at portions at which the incident electron doses are increased and, conversely, a higher height and a wider width at portions at which the incident electron doses are decreased.

* * * * *